(12) United States Patent
Chen et al.

(10) Patent No.: US 8,975,883 B2
(45) Date of Patent: Mar. 10, 2015

(54) SOFT START SCHEME UNDER LOW VOLTAGE POWER

(75) Inventors: Chih-Ning Chen, Taipei (TW); Yen-Ming Chen, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 369 days.

(21) Appl. No.: 13/594,896

(22) Filed: Aug. 27, 2012

(65) Prior Publication Data

US 2013/0285632 A1 Oct. 31, 2013

(30) Foreign Application Priority Data

Apr. 25, 2012 (TW) .............................. 101114668 A

(51) Int. Cl.
*H02M 1/36* (2007.01)

(52) U.S. Cl.
USPC .............................. 323/280; 363/49; 323/901

(58) Field of Classification Search
CPC ........................................................ H02M 1/36
USPC .............................. 323/282, 280, 901; 363/49
See application file for complete search history.

(56) References Cited

U.S. PATENT DOCUMENTS

| | | | | |
|---|---|---|---|---|
| 7,378,827 B2 * | 5/2008 | Stoichita | ....................... | 323/285 |
| 2012/0049829 A1 * | 3/2012 | Murakami | .................... | 323/288 |

FOREIGN PATENT DOCUMENTS

| | | |
|---|---|---|
| TW | 200810340 | 2/2008 |
| TW | 201025812 | 7/2010 |
| TW | 201027891 | 7/2010 |
| TW | I335704 | 1/2011 |
| TW | I340525 | 4/2011 |
| TW | I347065 | 8/2011 |
| TW | I350656 | 10/2011 |

* cited by examiner

*Primary Examiner* — Harry Behm
*Assistant Examiner* — Matthew Grubb
(74) *Attorney, Agent, or Firm* — Winston Hsu; Scott Margo

(57) ABSTRACT

A soft start circuit includes an error amplifier for generating a control signal according to an input voltage, a feedback voltage and a reference voltage, a feedback circuit for generating the feedback voltage according to an output voltage, an internal voltage source for generating a soft start voltage, and a sink circuit including a first transformation module for generating a first transformation current according to the soft start voltage, a second transformation module for generating a second transformation current according to the feedback voltage, a comparison module coupled to the first transformation module and the second transformation module for generating a comparison result according to the first transformation current and the second transformation current, and an output module coupled to the comparison module for generating a sink current according to the comparison result, so as to control the control signal.

15 Claims, 7 Drawing Sheets

SOFT START SCHEME UNDER LOW VOLTAGE POWER

BACKGROUND OF THE INVENTION

1. Field of the Invention

The present invention relates to a soft start circuit and a driving method thereof, and more particularly, to a soft start circuit and a driving method thereof which utilize a soft start voltage to correspondingly generate a sink current for soft start operation.

2. Description of the Prior Art

Electronic devices usually have different elements which operate with different operational voltages. Thus, it is necessary to utilize different DC-DC voltage converters in order to achieve different voltage modulations, such as modulation for raising voltage values or dropping voltage values, and to maintain them at predetermined voltage values. Many types of DC-DC voltage converters have been widely developed and are derived from the buck/step down converter or the boost/step up converter. The buck converter can decrease an input DC voltage to a default voltage level, and the boost converter can increase the input DC voltage to another default voltage level. With development, both the buck and boost converters are varied and modified to conform to different system architectures and requirements. Also, when relatively high sensitivity of load voltage changes is required, a user will choose an application circuit, which has a feedback voltage close to a load voltage, to dynamically output the load voltage for following operation.

Please refer to FIG. 1, which illustrates a conventional schematic diagram of an error amplifier 10. Since the error amplifier 10 utilizes a feedback voltage VFB close to an output voltage (not shown in figure), the error amplifier 10 has no choice but to utilize the N-type MOS transistor as an input stage circuit. As shown in FIG. 1, the error amplifier 10 applied to a voltage converter includes a first current mirror 100, a second current mirror 102, a first switch 104, a second switch 106, a current source 108 and a third current mirror 110. The first current mirror 100 includes P-type MOS transistors MP1, MP2. The second current mirror 102 includes P-type MOS transistors MP3, MP4. The first switch 104 and the second switch 106 are realized via N-type MOS transistors MN1, MN2. The third current mirror 110 includes N-type MOS transistors MN3, MN4. Sources of the transistors MP1, MP2, MP3 and MP4 receive an input voltage VIN. Gates of the transistors MP1, MP2 and a drain of the transistor MP2 are coupled to each other. Gates of the transistors MP3, MP4 and a drain of the transistor MP3 are coupled to each other. A drain of transistor MP1 is coupled to a drain of the transistor MN3 and gates of transistor MN3, MN4. A drain of the transistor MP2 is coupled to a drain of the transistor MN1. A drain of the transistor MP3 is coupled to a drain of the transistor MN2. A drain of the transistor MP4 is coupled to a drain of the transistor MN4 to output a control signal EO. Sources of the transistors MN1, MN2 are coupled to one end of the current source 108, and another end of the current source 108 is grounded. Sources of the transistors MN3 and MN4 are grounded. A gate of the transistor MN1 receives the feedback voltage VFB, and a gate of the transistor MN2 receives a reference voltage VREF.

In other words, the prior art utilizes the feedback voltage VFB and the reference voltage VREF to correspondingly switch on the first switch 104 and the second switch 106. Under such circumstances, the first current mirror 100, the second current mirror 102 and the third current mirror 110 transform a difference between the feedback voltage VFB and the reference voltage VREF into the control signal EO to provide to a following application circuit (not shown in figure). However, when the error amplifier 10 just initiates to have a larger difference between the feedback voltage VFB and the reference voltage VREF, generation of the control signal EO accompanies an in-rush current, which can possibly cause damage of the following application circuit for receiving the control signal EO. Please refer to FIG. 2, which illustrates a schematic diagram of generation of an output voltage VOUT and an output current IOUT of the following application circuit according to the corresponding control signal EO. As shown in FIG. 2, the output current IOUT is demonstrated as an oscillation current form while the error amplifier 10 just initiates and the output voltage VOUT increases accompanying larger in-rush currents, wherein the in-rush currents are marked with dotted circle. The output voltage VOUT has a threshold, which is correspondingly limited by values of the reference voltage VREF, so as to confine product application of the error amplifier 10. Also, the conventional soft start driver circuit can not be qualified if the N-type MOS transistor is utilized as the input stage circuit.

Therefore, it has become an important issue to provide another effective control circuit which avoids the in-rush current generation of the following application circuit, so as to provide a protection mechanism to the conventional soft start circuit.

SUMMARY OF THE INVENTION

It is therefore an objective of the invention to provide a soft start circuit and driving method thereof which avoids the in-rush current generation of the following application circuit, so as to provide a protection mechanism to the following application circuit.

The present invention discloses a soft start circuit including an error amplifier including a first current mirror for receiving an input voltage, a second current mirror coupled to the first current mirror for receiving the input voltage, a first switch comprising a first end coupled to the first current mirror, a second end for receiving a feedback voltage and a third end, a second switch comprising a first end coupled to the second current mirror, a second end for receiving a reference voltage and a third end coupled to the third end of the first switch and a current source, and a third current mirror coupled to the first current mirror and the second current mirror for generating a control signal according to a difference of the reference voltage and the feedback voltage, a feedback circuit coupled to the error amplifier for generating the feedback voltage according to an output voltage, an internal voltage source for generating a soft start voltage, and a sink circuit coupled to the error amplifier, the feedback circuit and the internal voltage source including a first transformation module for generating a first transformation current according to the soft start voltage, a second transformation module for generating a second transformation current according to the feedback voltage, a comparison module coupled to the first transformation module and the second transformation module for generating a comparison result according to the first transformation current and the second transformation current, and an output module coupled to the comparison module for generating a sink current according to the comparison result, so as to control an output condition of the control signal.

The present invention also discloses another method for controlling a soft start circuit including receiving an input voltage, generating a control signal according to a difference between a feedback voltage and a reference voltage, generating the feedback voltage according to an output voltage, generating a first transformation current according to a soft start voltage, generating a second transformation current according to the feedback voltage, generating a comparison result according to the first transformation current and the second transformation current, and generating a sink current to control an output condition of the control signal according to the comparison result.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
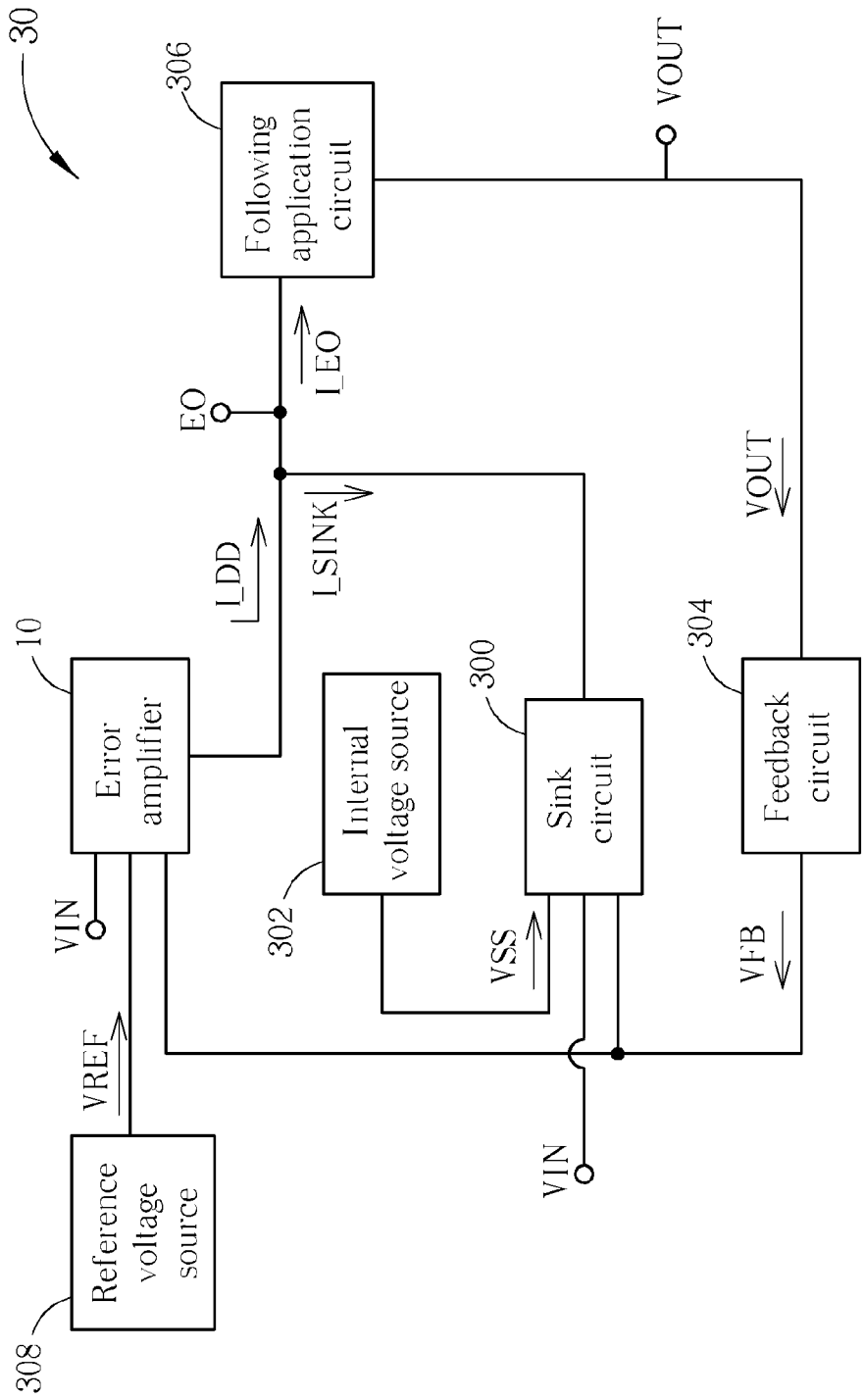
FIG. 3 illustrates a schematic diagram of a soft start circuit according to an embodiment of the invention.

Please refer to FIG. 3, which illustrates a schematic diagram of a soft start circuit 30 according to an embodiment of the invention. As shown in FIG. 3, the soft start circuit 30 not only includes the error amplifier 10 of the prior art, but also includes a sink circuit 300, an internal voltage source 302, a feedback circuit 304, a following application circuit 306 and a reference voltage source 308. The error amplifier 10 is coupled to the reference voltage source 308, the sink circuit 300 and the following application circuit 306 to receive an input voltage VIN, a reference voltage VREF generated by the reference voltage source 308 and a feedback voltage VFB. The detailed schematic diagram and operation of the error amplifier 10 is described in the above paragraphs, and is not described hereinafter. Besides, the sink circuit 300 is coupled to the internal voltage source 302 and the feedback circuit 304 to receive a soft start voltage VSS generated by the internal voltage source 302, the input voltage VIN and the feedback voltage VFB, so as to generate a sink current I_SINK. The following application circuit 306 can be any type of bootstrap boost/buck converter according to different users' requirements, so as to receive the control signal EO generated by the error amplifier 10. In simple, the soft start circuit 30 transforms the input voltage VIN into the control signal EO via the error amplifier 10, and the sink circuit 300 generates the sink current I_SINK according to the difference of the soft start voltage VSS and the feedback voltage VFB, so as to adjust an output condition of the control signal EO. Noticeably, in the embodiment, the control signal EO is demonstrated as a voltage value format, and the sink current I_SINK corresponds to a voltage change for increasing or reducing the values of the control signal EO. Certainly, those skilled in the art can utilize another current change format or other signal formats to represent the control signal EO, so as to adjust a current change or a signal change via the sink current I_SINK, which is also in the scope of the invention.

Figure 4:
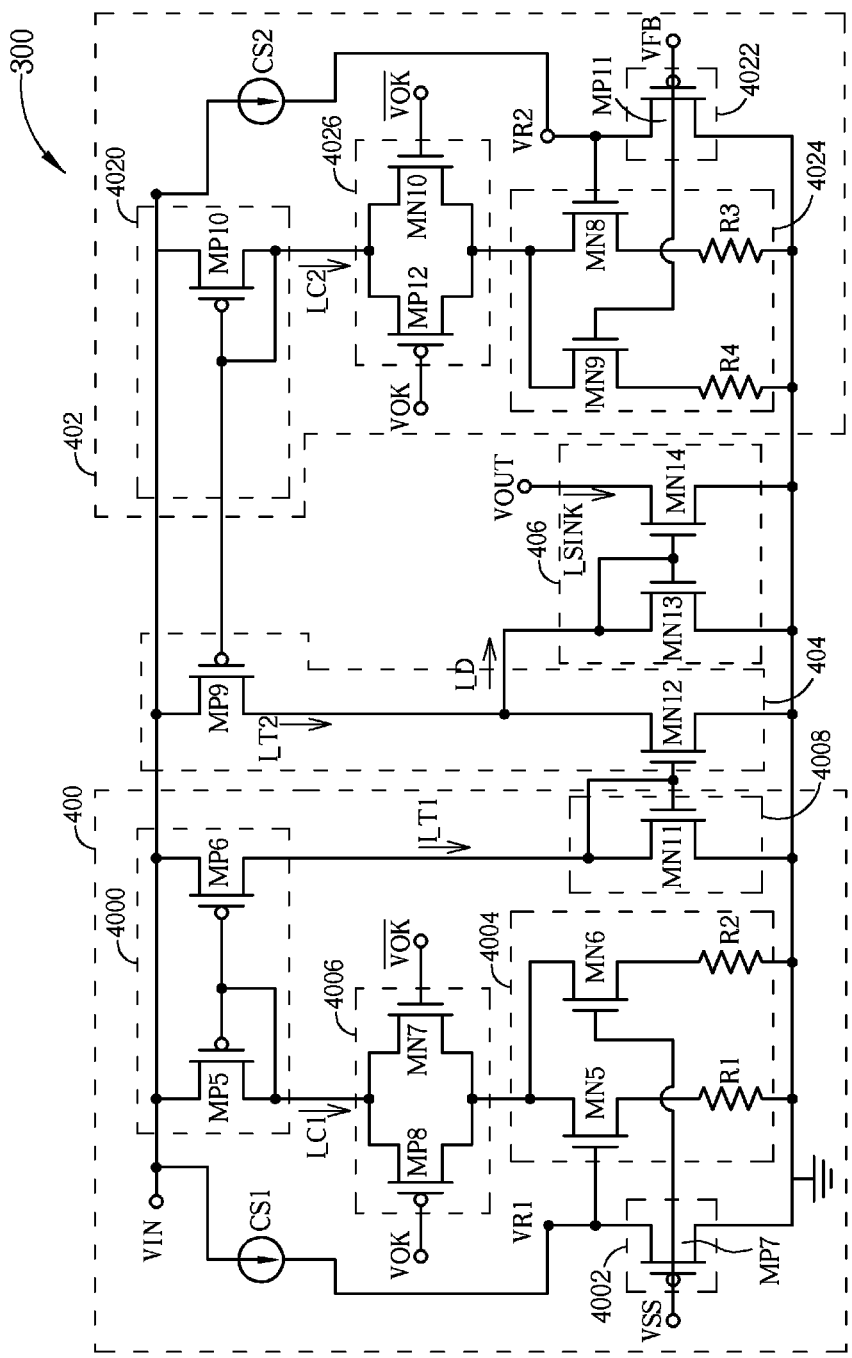
FIG. 4 illustrates a detailed schematic diagram of the sink circuit in FIG. 3 according to an embodiment of the invention.

Please refer to FIG. 4, which illustrates a detailed schematic diagram of the sink circuit 300 in FIG. 3 according to an embodiment of the invention. As shown in FIG. 4, the sink circuit 300 includes a first transformation module 400, a second transformation module 402, a comparison module 404 and an output module 406. The first transformation module 400 includes a fourth current mirror 4000, a third switch 4002, a first driver module 4004, a first switch circuit 4006 and a first output transistor 4008. The second transformation module 402 includes a first receipt transistor 4020, a fourth switch 4022, a second driver module 4024 and a second switch circuit 4026. In the first transformation module 400, the fourth current mirror is realized by P-type MOS transistors MP5, MP6; the third switch 4002 is realized by a P-type MOS transistor MP7; the first driver module 4004 is realized by N-type MOS transistors MN5, MN6 and resistors R1, R2; the first switch 4006 is realized by a P-type MOS transistor MP8 and a N-type MOS transistor MN7; and the first output transistor 4008 is realized by a N-type MOS transistor MN11. Besides, in the second transformation module 402, the first receipt transistor 4020 is realized by a P-type MOS transistor MP10; the fourth switch 4022 is realized by a P-type MOS transistor MP11; the second driver module 4024 is realized by N-type MOS transistors MN8, MN9 and resistors R3, R4; and the second switch circuit 4026 is realized by a P-type MOS transistor MP12 and a N-type MOS transistor MN10. The comparison module 404 is realized by a P-type MOS transistor MP9 and an N-type MOS transistor MN12. The output module 406 is realized by N-type MOS transistors MN13, MN14. The input voltage VIN is coupled to current sources CS1, CS2 to generate reference voltages VR1, VR2.

Figure 5:
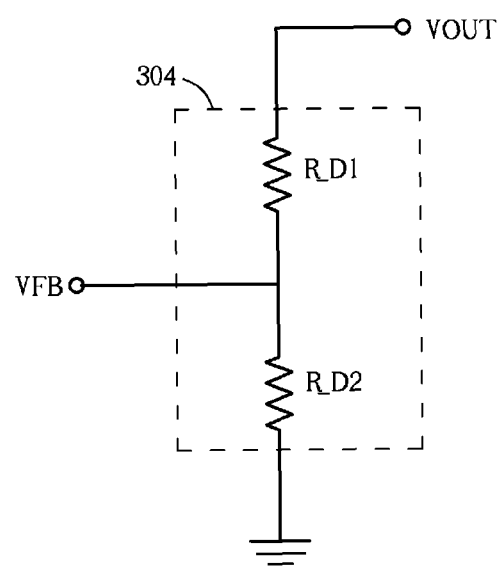
FIG. 5 illustrates a detailed schematic diagram of the feedback circuit in FIG. 3 according to an embodiment of the invention.

Please refer to FIG. 5, which illustrates a detailed schematic diagram of the feedback circuit 304 in FIG. 3 according to an embodiment of the invention. As shown in FIG. 5, the feedback circuit 304 includes division resistors R_D1, R_D2 with resistances Rest_1, Rest_2, respectively. According to a resistance ratio Rest_1/(Rest_1+Rest_2) of the division resistors R_D1, R_D2, an output voltage VOUT of the following application circuit 306 is transformed into the feedback voltage VFB. Generally, the smaller is the resistance Rest_1 divided by the resistance Rest_2, the more sensitive is the feedback voltage VFB, which also means that the feedback voltage VFB can be immediately generated to influence the voltage value of the output voltage VOUT. According to different users' requirements, adjustment of the appropriate resistance ratio can be made to dynamically generate the output voltage VOUT accompanying the feedback voltage VFB, which is also in the scope of the invention.

Please refer to FIG. 4. Operation of the first transformation module 400 is described in the following. The sources of the transistor MP5 and MP6 are coupled with the input voltage VIN. The drain of the transistor MP5 is coupled to the first driver module 4004 via the first switch circuit 4006, and is also coupled to the gates of the transistors MP5 and MP6. The gate of the transistor MP7 is utilized to receive the soft start voltage VSS, so as to control the conduction condition of the transistor MP7. The first driver module 4004 includes two conduction paths, wherein one of the conduction paths is formed via the transistor MN5 and the resistor R1 and the other conduction path is formed via the transistor MN6 and the resistor R2. Both of the conduction paths are sequentially conducted according to the reference voltage VR1, the soft start voltage VSS and the conduction condition of the transistor MP7. When the first switch circuit 4006 is conducted, a conduction current I_C1 passing through the transistor MP5 is formed according to the soft start voltage VSS, the third switch 4002 and the first driver module 4004. The transistor MP6 copies the conduction current I_C1 of the transistor MP5 to transform the soft start voltage VSS into a first transformation current I_T1. Lastly, the drain of the first output transistor 4008 is coupled to the drain of the transistor MP6 to output the first transformation current I_T1 to the comparison module 404.

Operation of the second transformation module 402 is similar to the first transformation module 400. The source of the transistor MP10 is coupled to the input voltage VIN. The drain of the transistor MP10 is coupled to the second driver module 4024 via the second switch circuit 4026, and is also coupled to the gate of the transistor MP10 and the gate of the transistor MP9 of the comparison module 404. The gate of the transistor MP11 is utilized to receive the feedback voltage VFB, so as to control the conduction condition of the transistor MP11. The second driver module 4024 also includes two conduction paths, wherein one of the conduction paths is formed via the transistor MN8 and the resistor R3 and the other conduction path is formed via the transistor MN9 and the resistor R4. Both of the conduction paths are sequentially conducted according to the reference voltage VR2, the feedback voltage VFB and the conduction condition of the transistor MP11. When the second switch circuit 4026 is conducted, a conduction current I_C2 passing through the transistor MP10 is formed according to the feedback voltage VFB, the fourth switch 4022 and the second driver module 4024, so as to transform the feedback voltage VFB into a second transformation current I_T2. Lastly, the transistor MP10 is combined with the transistor MP9 of the comparison module 404 to form a current mirror, so as to copy the second transformation current I_T2 of the transistor MP10 to output to the comparison module 404.

Additionally, the comparison module 404 utilizes the transistors MN12 and MN9 to receive the first transformation current I_T1 and the second transformation current I_T2, respectively. Accordingly, difference between the first transformation current I_T1 and the second transformation current I_T2 is utilized to generate a difference current I_D. The transistor MN13 of the output module 406 is utilized to receive the difference current I_D, and the transistor MN14 is utilized to copy the difference current I_D, so as to generate the sink current I_SINK correspondingly.

Noticeably, the conduction conditions of the first switch circuit 4006 and the second switch circuit 4026 can be controlled via an enabling signal VOK (or an inverting signal $\overline{VOK}$ of the enabling signal VOK), so as to control conduction conditions of the transistors MP8 and MN7 of the first switch circuit 4006 and the transistors MP12 and MN10 of the second switch circuit 4026. Accordingly, the transistor MP5 and the first transformation module 400 are electrically conducted, so is the transistor MP10 and the second transformation module 402. In the embodiment, the enabling signal VOK (or $\overline{VOK}$) is correspondingly generated according to changes of the difference current I_D. Other internal/external circuits can also be utilized to generate a control signal as the enabling signal VOK (or $\overline{VOK}$), which is also in the scope of the invention. Therefore, the user can adaptively switch on or off the first switch circuit 4006 and the second switch circuit 4026, so as to correspondingly control the conduction condition of the sink circuit 300 to operate as a switching mechanism. When not necessary for the user to utilize the soft start circuit 30, the above switching mechanism can be utilized to save consumption power of the soft start circuit 30 and to increase the product application range of the soft start circuit 30. Certainly, those skilled in the art can modify the conception of the first switch circuit 4006 and the second switch circuit 4026 to combine other switch elements or electrical conduction mechanism, so as to correspondingly switch on or off the sink circuit 300, which is also in the scope of the invention.

Please refer to FIG. 3, an error-amplifier current I_DD outputted by the error amplifier 10 is approximately equivalent to an addition of the sink current I_SINK and an output current I_EO. Under such circumstances, the embodiment of the invention adjusts the values of the sink current I_SINK to adjust values of the output current I_EO, so as to control voltage changes of the control signal EO. In other words, the embodiment of the invention simultaneously utilizes the error amplifier 10 and the sink circuit 300 to generate the control signal EO according to the difference between the reference voltage VREF and the feedback voltage VFB, so as to output the control signal EO to the following application circuit 306 to generate the output voltage VOUT. When the soft start circuit 30 just initiates, the embodiment compares the soft start voltage VSS and the feedback voltage VFB to generate the current I_SINK. After the current I_SINK is subtracted from the current I_DD to obtain the output current I_EO, the output current I_EO is provided for the following application circuit 306 as the soft start operation. Under such circumstances, the soft start voltage VSS is still larger than the feedback voltage VFB. Accordingly, the sink circuit 300 of the invention decreases the values of the sink current I_SINK, so as to correspondingly increase the values of the output current I_EO and to accelerate increases of the control signal EO. Accompanying the increases of the control signal EO, the feedback voltage VFB is increasingly equivalent to the soft start voltage VSS. Under such circumstances, the sink circuit 300 of the invention increases the values of the sink current I_SINK, so as to correspondingly decrease the values of the output current I_EO and to slow down the increases of the control signal EO. Once the feedback voltage VFB equals the reference voltage VREF, the enabling signal VOK (or $\overline{VOK}$) in the embodiment is utilized to switch off the sink circuit 300, and the error amplifier 100 is only utilized to generate the control signal EO, so as to complete the soft start operation of the following application circuit 306.

Figure 6:
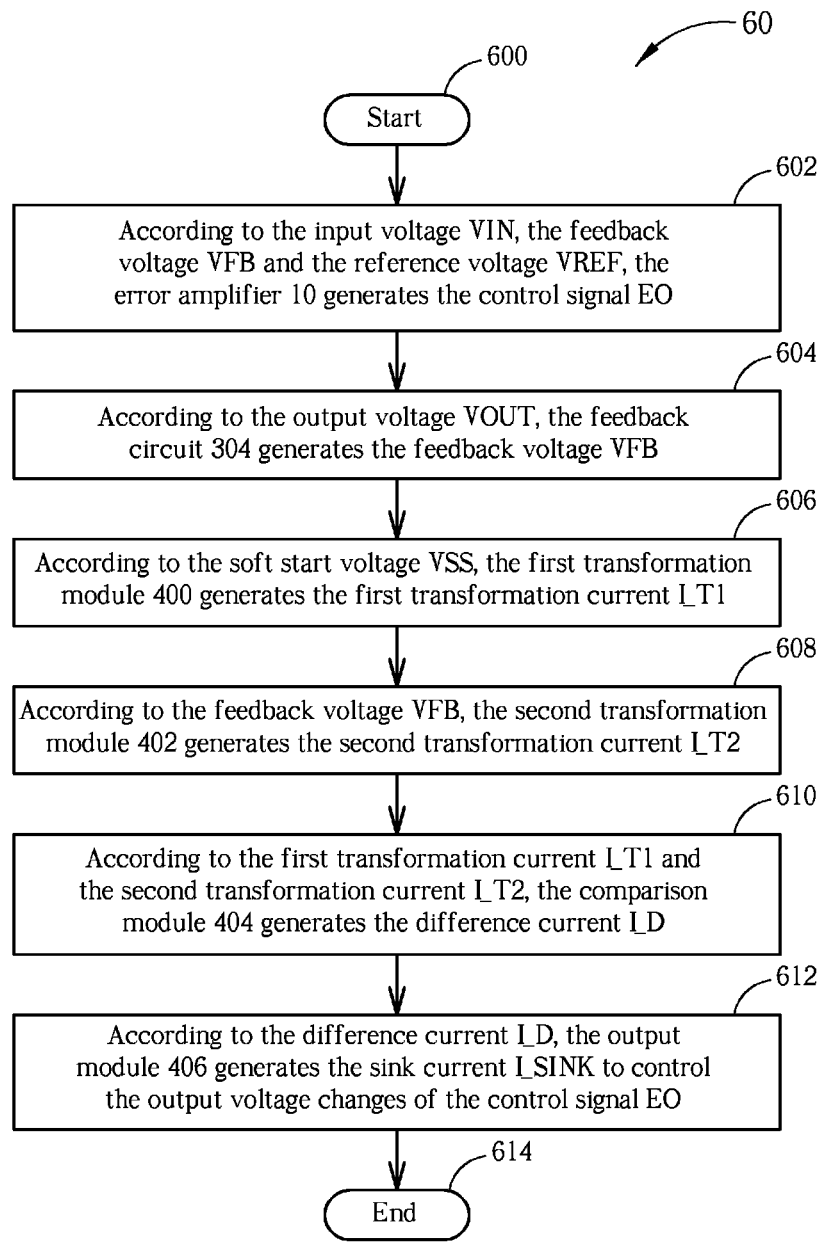
FIG. 6 illustrates a flow chart of a soft start circuit control process according to an embodiment of the invention.

In simple, the soft start circuit 30 of the invention simultaneously utilizes the error amplifier 10 and the sink circuit 300 to dynamically adjust the values of the sink current I_SINK, so as to transform the difference between the reference voltage VREF and the feedback voltage VFB into the control signal EO. Further, the operation of the soft start circuit 30 can be summarized as a soft start circuit control process 60, as shown in FIG. 6. The soft start circuit control process 60 includes the steps as follows:

Step 600: Start.

Step 602: According to the input voltage VIN, the feedback voltage VFB and the reference voltage VREF, the error amplifier 10 generates the control signal EO.

Step 604: According to the output voltage VOUT, the feedback circuit 304 generates the feedback voltage VFB.

Step 606: According to the soft start voltage VSS, the first transformation module 400 generates the first transformation current I_T1.

Step 608: According to the feedback voltage VFB, the second transformation module 402 generates the second transformation current I_T2.

Step 610: According to the first transformation current I_T1 and the second transformation current I_T2, the comparison module 404 generates the difference current I_D.

Step 612: According to the difference current ID, the output module 406 generates the sink current I_SINK to control the output voltage changes of the control signal EO.

Step 614: End.

The detailed steps of the soft start circuit control process 60 can be understood via the soft start circuit 30, FIG. 1, FIG. 3 to FIG. 5 and their related paragraphs, which is not described hereinafter. In comparison with the prior art, the soft start circuit control process 60 simultaneously utilizes Step 602 and Step 612 to adjust the output voltage changes of the control signal EO. Certainly, those skilled in the art can directly combine operation of Step 602 and Step 612 to simultaneously compare the reference voltage VREF, the feedback voltage VFB and the soft start voltage VSS to obtain the difference thereof, so as to adjust the values of the sink current I_SINK and to adjust the output voltage changes of the control signal EO, which is also in the scope of the invention.

Figure 1:
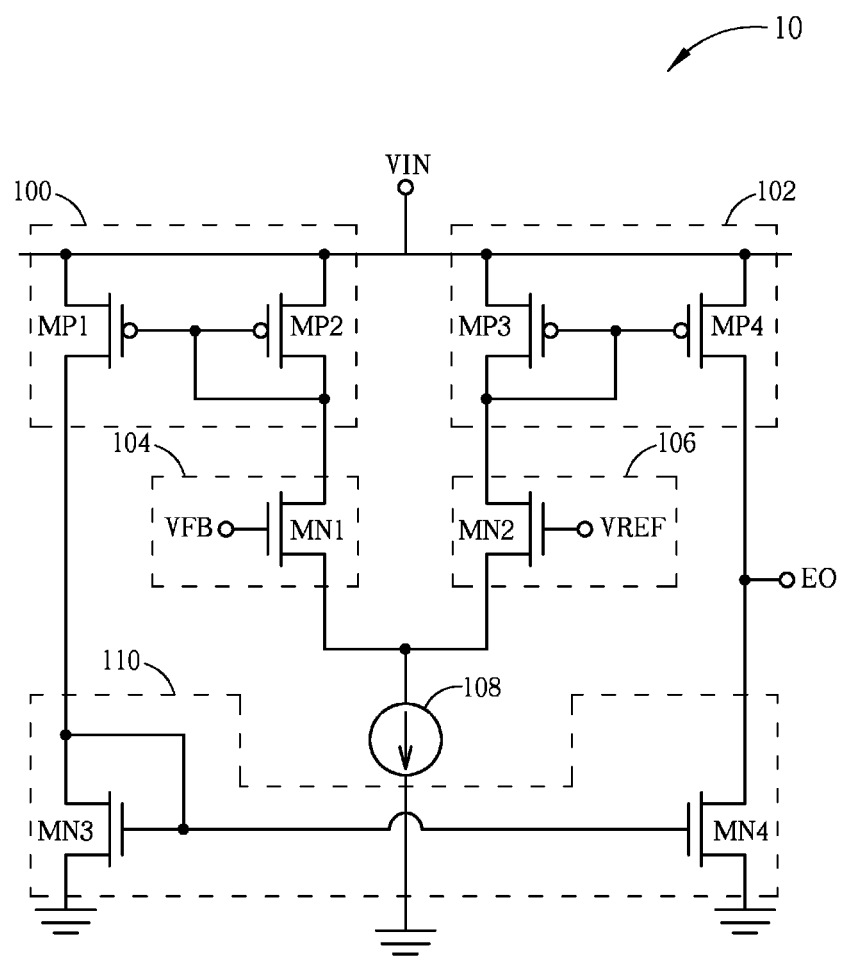
FIG. 1 illustrates a conventional schematic diagram of an error amplifier.
Figure 2:
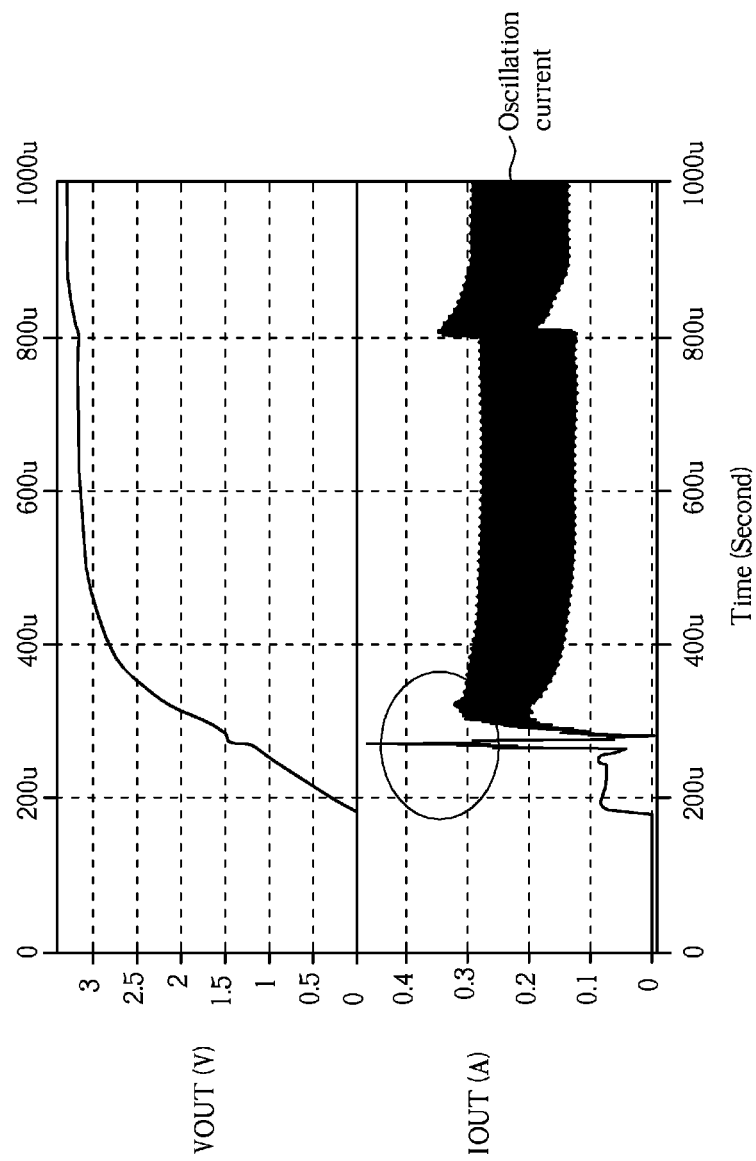
FIG. 2 illustrates a schematic diagram of generation of an output voltage and an output current of the following application circuit according to the corresponding control signal.
Figure 7:
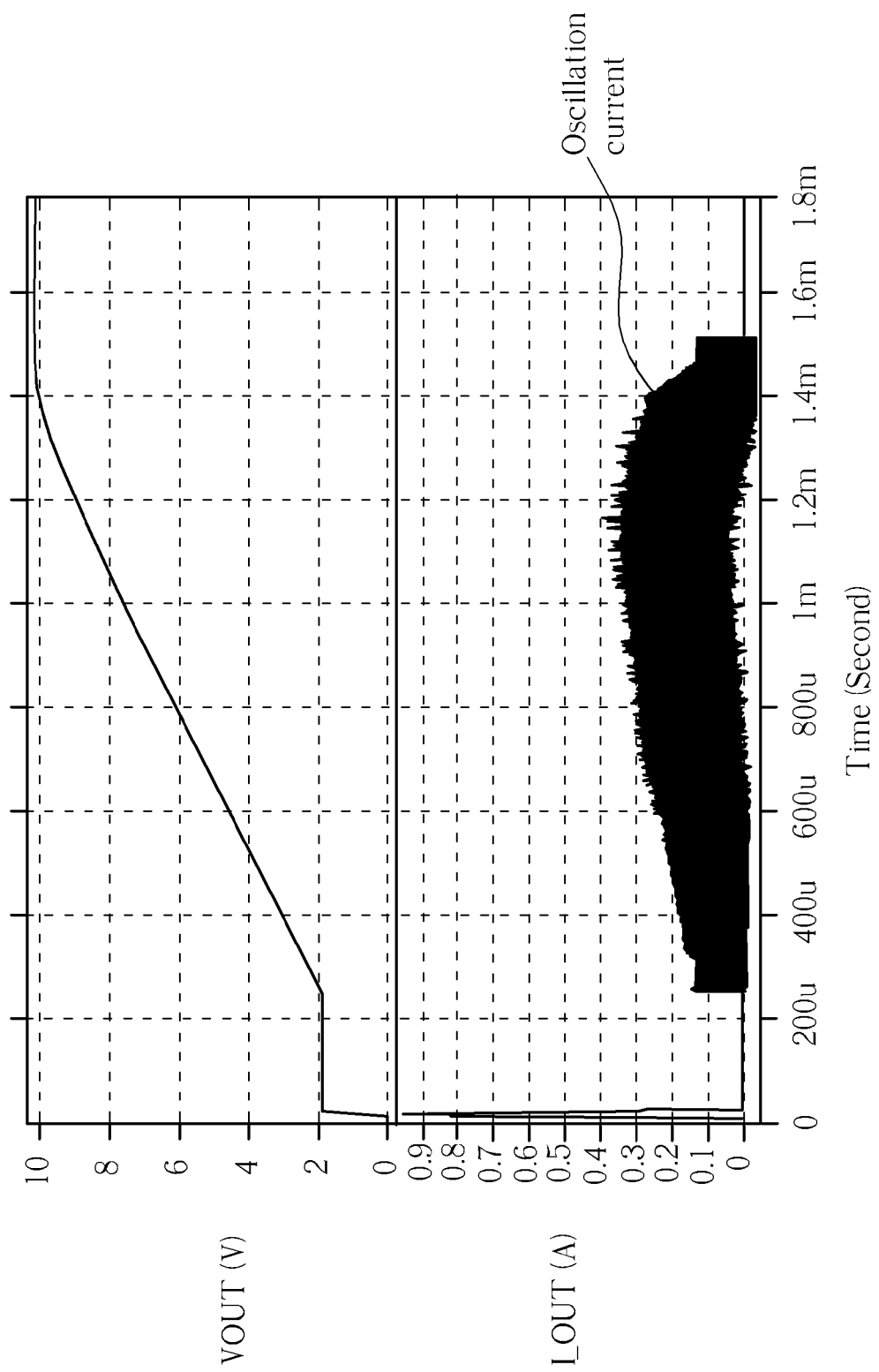
FIG. 7 illustrates a schematic diagram of generation of the output voltage and the output current of the following application circuit coupled to the soft start circuit according to an embodiment of the invention.

Please refer to FIG. 7, which illustrates a schematic diagram of generation of the output voltage VOUT and the output current I_OUT of the following application circuit 306 coupled to the soft start circuit 30 according to an embodiment of the invention. As shown in FIG. 7, after the soft start circuit 30 initiates to simultaneously operate the sink circuit 300 and the error amplifier 10, the output voltage VOUT of the following application circuit 306 is demonstrated as a straight sloped line. The output current I_OUT of the following application circuit 306 shows no evidence of the in-rush current shown in FIG. 2 to be an oscillation current, wherein the output current I_OUT is depicted by linking the maximum oscillation value of the oscillation current. While the following application circuit 306 just initiates, such as from the beginning to 600 microseconds, the values of the output current I_OUT can be smaller than the output current IOUT of the prior art, which is capable of providing the soft start operation of the following application circuit 306. Since the in-rush current similar to the prior art has been avoided, a better protection mechanism is provided for the following application circuit 306.

Noticeably, when the input voltage VIN is close to the reference voltage VREF, the soft start circuit 30 of the invention can still be normally operated. In comparison, the prior art only including the error amplifier 10 fails if operated for the same soft start operation. Besides, those skilled in the art can further combine a plurality of sink circuits 300 of the invention to correspondingly provide a plurality of different soft start voltages VSS to be compared with the feedback voltage VFB, which provides a more variety of comparison/adjustment mechanisms in comparison with the prior art with merely comparing the reference voltage VREF and the feedback voltage VFB. A wider product application of the soft start circuit 30 can be anticipated.

Preferably, although the utilization of P-type or N-type transistors causes the body effect, the soft start circuit 30 of the invention has a symmetrical structure, which leads to no significant corresponding effects of the operation of the soft start circuit 30 and renders no limitations of bulk/body pin positions.

In summary, the invention provides a soft start circuit, which includes a sink circuit being utilized to obtain a difference between a soft start voltage and a feedback voltage, so as to generate a sink current and to adjust values of an error amplifier current outputted by an error amplifier. Thus, output voltage ranges of a control signal can be controlled, and a comparison result of the soft start voltage and the feedback voltage is utilized to adaptively control a conduction condition of the sink circuit. More consumption power of the soft start circuit can be saved, and an in-rush current similar to the prior art can be avoided as well. Therefore, a loading circuit coupled to the sink circuit is provided with a better protection mechanism to increase a production application of the soft start circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A soft start circuit comprising:
    an error amplifier comprising:
        a first current mirror for receiving an input voltage;
        a second current mirror coupled to the first current mirror for receiving the input voltage;
        a first switch comprising a first end coupled to the first current mirror, a second end for receiving a feedback voltage and a third end;
        a second switch comprising a first end coupled to the second current mirror, a second end for receiving a reference voltage and a third end coupled to the third end of the first switch and a current source; and
        a third current mirror coupled to the first current mirror and the second current mirror for generating a control signal according to a difference of the reference voltage and the feedback voltage;
    a feedback circuit coupled to the error amplifier for generating the feedback voltage according to an output voltage;
    an internal voltage source for generating a soft start voltage; and
    a sink circuit coupled to the error amplifier, the feedback circuit and the internal voltage source, comprising:
        a first transformation module for generating a first transformation current according to the soft start voltage;
        a second transformation module for generating a second transformation current according to the feedback voltage;
        a comparison module coupled to the first transformation module and the second transformation module for generating a comparison result according to the first transformation current and the second transformation current; and
        an output module coupled to the comparison module for generating a sink current according to the comparison result, so as to control an output condition of the control signal.

2. The soft start circuit of claim 1, wherein the first transformation module further comprises:
    a third switch for determining a conduction condition of the third switch according to the soft start voltage;
    a first driver module comprising at least one transistor comprising a first end coupled to the third switch, a second end coupled to a resistor and a third end determining a conduction current of the first driver module according to the conduction condition of the third switch;
    a fourth current mirror comprising one end for receiving the input voltage and another end coupled to the first driver module for generating the first transformation current according to the conduction current of the first driver module; and
    a first output transistor coupled to the fourth current mirror for outputting the first transformation current.

3. The soft start circuit of claim 1, wherein the second transformation module further comprises:

a fourth switch for determining a conduction condition of the fourth switch according to the feedback voltage;

a second driver module comprising at least one transistor comprising a first end coupled to the fourth switch, a second end coupled to a resistor and a third end determining a conduction current of the second driver module according to the conduction condition of the fourth switch; and a first receipt transistor comprising one end for receiving the input voltage and another end coupled to the second driver module for generating the second transformation current according to the conduction current of the second driver module.

4. The soft start circuit of claim 1, wherein the comparison module utilizes two coupled transistors to generate the comparison result, which is a difference between the first transformation current and the second transformation current to correspondingly generate a difference current.

5. The soft start circuit of claim 4, wherein the output module generates the sink current according to the difference current, so as to raise or lower a voltage change or a current change of the control signal.

6. The soft start circuit of claim 1, wherein the sink circuit further comprises a plurality of switch circuits, and each of the switch circuits controls a conduction condition thereof according to a control signal.

7. The soft start circuit of claim 6, wherein each of the plurality of switch circuits comprises a P-type MOS transistor and an N-type MOS transistor, and a gate of the P-type MOS transistor as well as a gate of the N-type MOS transistor receive the comparison result to control the conduction condition of the each of the plurality of switch circuits.

8. The soft start circuit of claim 1, wherein the feedback circuit comprises a plurality of voltage-division resistors to transform the control signal into the feedback signal according to a resistance ratio of the plurality of voltage-division resistors.

9. The soft start circuit of claim 1, further comprising a following application circuit coupled to the third current mirror and the feedback circuit.

10. The soft start circuit of claim 9, wherein the following application circuit generates a voltage change or a current change via comparing a difference between the reference voltage and the feedback voltage as well as a difference between the soft start voltage and the feedback voltage.

11. The soft start circuit of claim 9, wherein the following application circuit generates the output voltage according to the control signal.

12. A method for controlling a soft start circuit comprises:

receiving an input voltage;

generating a control signal according to a difference between a feedback voltage and a reference voltage;

generating the feedback voltage according to an output voltage;

generating a first transformation current according to a soft start voltage;

generating a second transformation current according to the feedback voltage;

generating a comparison result according to the first transformation current and the second transformation current, wherein the comparison result is a difference current between the first transformation current and the second transformation current; and generating a sink current to control an output condition of the control signal according to the comparison result.

13. The method of claim 12, further comprising generating the sink current according to the difference current, so as to raise or lower a voltage change or a current change of the control signal.

14. The method of claim 12, further comprising generating a voltage change or a current change of a following application circuit via comparing a difference between the reference voltage and the feedback voltage as well as a difference between the soft start voltage and the feedback voltage.

15. The method of claim 12, further comprising generating the output voltage according to the control signal.

* * * * *